United States Patent [19]
Lan et al.

[11] Patent Number: 5,962,815
[45] Date of Patent: Oct. 5, 1999

[54] ANTIFUSE INTERCONNECT BETWEEN TWO CONDUCTING LAYERS OF A PRINTED CIRCUIT BOARD

[75] Inventors: James J. D. Lan, Fremont; Steve S. Chiang, Saratoga, both of Calif.; William H. Shepherd, Placitas, N.Mex.; Paul Y. F. Wu, San Jose, Calif.

[73] Assignee: Prolinx Labs Corporation, San Jose, Calif.

[21] Appl. No.: 08/374,941

[22] Filed: Jan. 18, 1995

[51] Int. Cl.⁶ ........................................... H01R 9/09
[52] U.S. Cl. ........................... 174/262; 257/665; 361/779
[58] Field of Search ..................... 174/262, 250, 174/264, 265, 261, 255; 257/530, 665, 209, 529; 361/779, 777; 29/847

[56] References Cited

U.S. PATENT DOCUMENTS

| | | | |
|---|---|---|---|
| 3,335,327 | 8/1967 | Damon et al. | 361/767 |
| 3,384,879 | 5/1968 | Stahl et al. | |
| 3,615,913 | 10/1971 | Shaw | 148/33.3 |
| 3,770,529 | 11/1973 | Anderson | 156/3 |
| 3,808,576 | 4/1974 | Castonguay et al. | 338/309 |
| 3,857,683 | 12/1974 | Castonguay | 428/608 |
| 3,923,359 | 12/1975 | Newsam | 439/75 |
| 4,024,629 | 5/1977 | Lemoine et al. | 29/625 |
| 4,090,667 | 5/1978 | Crimmins | 439/189 |
| 4,146,863 | 3/1979 | Mollenhoff | 337/296 |
| 4,238,839 | 12/1980 | Redfern et al. | 365/96 |
| 4,245,273 | 1/1981 | Feinberg et al. | 361/703 |
| 4,247,981 | 2/1981 | Walters | 29/845 |
| 4,386,051 | 5/1983 | Edgington | 420/589 |
| 4,399,372 | 8/1983 | Tanimoto et al. | 327/526 |
| 4,413,272 | 11/1983 | Mochizuki et al. | 357/65 |
| 4,420,820 | 12/1983 | Preedy | 365/105 |
| 4,424,578 | 1/1984 | Miyamoto | 365/104 |
| 4,433,331 | 2/1984 | Kollaritsch | 340/825.83 |
| 4,434,134 | 2/1984 | Darrow et al. | 419/5 |

(List continued on next page.)

FOREIGN PATENT DOCUMENTS

| | | |
|---|---|---|
| 0336359 | 10/1989 | European Pat. Off. |
| 59-13368 | 1/1984 | Japan . |
| 2-281685 | 11/1990 | Japan . |

OTHER PUBLICATIONS

Joshua Silver, "High–Performance Scalable Switch Design," ASIC & EDA, Jun. 1994, pp. 38–48.

Kathryn E. Gordon and Richard J. Wong, "Conducting Filament of the Programmed Metal Electrode Amorphous Silicon Antifuse," IEEE, 1993, pp. 27–30.

Paul C. Yu, Steven J. Decker, Hae–Seung Lee, Charles G. Sodini and John L. Wyatt, "CMOS Resistive Fuses for Image Smoothing and Segmentation," 1992 IEEE, IEEE Journal of Solid–State Circuits, vol. 27, No. 4, Apr. 1992, pp. 545–553.

(List continued on next page.)

*Primary Examiner*—Kristine Kincaid
*Assistant Examiner*—Kamand Cuneo
*Attorney, Agent, or Firm*—Skjerven, Morrill, MacPherson, Franklin & Friel; Alan H. MacPherson; Omkar K. Suryadevara

[57] ABSTRACT

A multilayered structure, such as a printed circuit board, includes a first conductive layer and a second conductive layer that are separated from each other by a dielectric layer. The dielectric layer is formed of a first material, such as a photoimagible polyimide and epoxy resin. The dielectric layer has a number of via holes that extend from the first conductive layer to the second conductive layer. The via holes are filled with a second material having a breakdown voltage less than a breakdown voltage of the first material included in the dielectric layer to form an antifuse. The second material in the via holes can be, for example, a conductive epoxy resin or a polymer loaded with conductive particles (also referred to as "conductive paste").

11 Claims, 7 Drawing Sheets

U.S. PATENT DOCUMENTS

| | | | |
|---|---|---|---|
| 4,455,495 | 6/1984 | Masuhara et al. | 327/525 |
| 4,458,297 | 7/1984 | Stopper et al. | 361/771 |
| 4,488,262 | 12/1984 | Basire et al. | 365/104 |
| 4,491,860 | 1/1985 | Lim | 357/68 |
| 4,507,756 | 3/1985 | McElroy | 365/104 |
| 4,507,757 | 3/1985 | McElroy | 365/104 |
| 4,547,830 | 10/1985 | Yamauchi | 361/104 |
| 4,562,639 | 1/1986 | McElroy | 437/7 |
| 4,565,712 | 1/1986 | Noguchi et al. | 437/19 |
| 4,566,186 | 1/1986 | Bauer et al. | 29/852 |
| 4,569,120 | 2/1986 | Stacy et al. | 437/24 |
| 4,569,121 | 2/1986 | Lim et al. | 437/52 |
| 4,585,490 | 4/1986 | Raffel et al. | 437/198 |
| 4,590,589 | 5/1986 | Gerzberg | 365/100 |
| 4,609,241 | 9/1986 | Peterson | 439/68 |
| 4,642,160 | 2/1987 | Burgess | 156/630 |
| 4,651,409 | 3/1987 | Ellsworth et al. | 437/52 |
| 4,652,974 | 3/1987 | Ryan | 361/739 |
| 4,678,889 | 7/1987 | Yamanaka | 219/121.69 |
| 4,689,441 | 8/1987 | Dick et al. | 174/250 |
| 4,700,116 | 10/1987 | Inoue et al. | 318/254 |
| 4,700,214 | 10/1987 | Johnson | 357/68 |
| 4,710,592 | 12/1987 | Kimbara | 174/262 |
| 4,721,868 | 1/1988 | Cornell et al. | 326/38 |
| 4,726,991 | 2/1988 | Hyatt et al. | 428/329 |
| 4,731,704 | 3/1988 | Lochner | 361/760 |
| 4,732,780 | 3/1988 | Mitoff et al. | 427/125 |
| 4,748,490 | 5/1988 | Hollingsworth | 257/530 |
| 4,757,359 | 7/1988 | Chiao et al. | 257/37 |
| 4,780,670 | 10/1988 | Cherry | 324/158 |
| 4,786,904 | 11/1988 | Graham, III et al. | 340/825.83 |
| 4,789,760 | 12/1988 | Koyama et al. | 174/68.5 |
| 4,791,075 | 12/1988 | Lin | 437/209 |
| 4,792,646 | 12/1988 | Enomoto | 174/266 |
| 4,792,835 | 12/1988 | Sacarisen et al. | 257/379 |
| 4,796,074 | 1/1989 | Roesner | 257/476 |
| 4,796,075 | 1/1989 | Whitten | 257/665 |
| 4,799,128 | 1/1989 | Chen | 361/795 |
| 4,799,984 | 1/1989 | Rellick | 156/89 |
| 4,803,595 | 2/1989 | Kraus et al. | 361/412 |
| 4,808,967 | 2/1989 | Rice et al. | 338/784 |
| 4,821,142 | 4/1989 | Ushifusa et al. | 361/739 |
| 4,823,181 | 4/1989 | Mohsen et al. | 257/530 |
| 4,829,404 | 5/1989 | Jensen | 361/749 |
| 4,839,864 | 6/1989 | Fujishima | 365/200 |
| 4,840,924 | 6/1989 | Kinbara | 437/189 |
| 4,841,099 | 6/1989 | Epstein et al. | 174/68.5 |
| 4,845,315 | 7/1989 | Stopper | 361/827 |
| 4,847,732 | 7/1989 | Stopper et al. | 361/739 |
| 4,861,854 | 8/1989 | Sugio et al. | 528/125 |
| 4,864,165 | 9/1989 | Hoberman et al. | 307/467 |
| 4,873,506 | 10/1989 | Gurevich | 337/290 |
| 4,874,711 | 10/1989 | Hughes et al. | 437/8 |
| 4,876,220 | 10/1989 | Mohsen et al. | 437/170 |
| 4,881,114 | 11/1989 | Mohsen et al. | 257/530 |
| 4,882,611 | 11/1989 | Blech et al. | 257/50 |
| 4,888,574 | 12/1989 | Rice et al. | 338/309 |
| 4,888,665 | 12/1989 | Smith | 361/780 |
| 4,892,776 | 1/1990 | Rice | 428/209 |
| 4,893,167 | 1/1990 | Boudou et al. | 257/758 |
| 4,897,836 | 1/1990 | Fitzpatrick et al. | 370/241 |
| 4,899,205 | 2/1990 | Hamdy et al. | 257/530 |
| 4,910,418 | 3/1990 | Graham et al. | 326/38 |
| 4,910,584 | 3/1990 | Mizuo | 257/713 |
| 4,914,055 | 4/1990 | Gordon et al. | 437/192 |
| 4,915,983 | 4/1990 | Lake et al. | 427/98 |
| 4,916,809 | 4/1990 | Boudou et al. | 29/852 |
| 4,920,454 | 4/1990 | Stopper et al. | 361/749 |
| 4,924,287 | 5/1990 | Orbach | 257/204 |
| 4,933,738 | 6/1990 | Orbach et al. | 357/51 |
| 4,935,584 | 6/1990 | Boggs | 174/262 |
| 4,937,475 | 6/1990 | Rhodes et al. | 326/41 |
| 4,940,181 | 7/1990 | Juskey, Jr. et al. | 228/180.2 |
| 4,943,538 | 7/1990 | Mohsen et al. | 437/52 |
| 4,949,084 | 8/1990 | Schwartz et al. | 340/825.83 |
| 4,964,948 | 10/1990 | Reed | 156/659.1 |
| 4,969,124 | 11/1990 | Luich et al. | 365/201 |
| 4,970,579 | 11/1990 | Arldt et al. | 257/718 |
| 4,974,048 | 11/1990 | Chakravorty et al. | 357/40 |
| 4,977,357 | 12/1990 | Shrier | 338/21 |
| 4,992,333 | 2/1991 | Hyatt | 428/402 |
| 5,003,486 | 3/1991 | Hendel et al. | 364/483 |
| 5,014,002 | 5/1991 | Wiscombe et al. | 324/158 F |
| 5,027,191 | 6/1991 | Bourdelaise et al. | 357/74 |
| 5,030,113 | 7/1991 | Wilson | 439/80 |
| 5,055,321 | 10/1991 | Enomoto et al. | 427/98 |
| 5,055,973 | 10/1991 | Mohsen | 361/792 |
| 5,060,116 | 10/1991 | Grobman et al. | 361/792 |
| 5,068,634 | 11/1991 | Shrier | 338/21 |
| 5,072,289 | 12/1991 | Sugimoto et al. | 357/68 |
| 5,077,451 | 12/1991 | Mohsen | 174/261 |
| 5,087,589 | 2/1992 | Chapman et al. | 437/195 |
| 5,092,032 | 3/1992 | Murakami | 29/830 |
| 5,097,593 | 3/1992 | Jones et al. | 29/852 |
| 5,099,149 | 3/1992 | Smith | 326/38 |
| 5,099,380 | 3/1992 | Childers et al. | 361/56 |
| 5,106,773 | 4/1992 | Chen et al. | 437/51 |
| 5,108,541 | 4/1992 | Schneider et al. | 216/19 |
| 5,118,385 | 6/1992 | Kumar et al. | 156/644 |
| 5,120,679 | 6/1992 | Boardman et al. | 437/195 |
| 5,136,366 | 8/1992 | Worp et al. | 257/687 |
| 5,142,263 | 8/1992 | Childers et al. | 338/21 |
| 5,144,567 | 9/1992 | Olesch et al. | 361/680 |
| 5,148,265 | 9/1992 | Khandros et al. | 257/773 |
| 5,148,355 | 9/1992 | Lowe et al. | 361/410 |
| 5,155,577 | 10/1992 | Chance et al. | 257/773 |
| 5,166,556 | 11/1992 | Hsu et al. | 326/41 |
| 5,181,096 | 1/1993 | Forouhi | 257/530 |
| 5,181,859 | 1/1993 | Foreman et al. | 439/225 |
| 5,189,387 | 2/1993 | Childers et al. | 338/20 |
| 5,191,511 | 3/1993 | Sawaya | 361/703 |
| 5,196,724 | 3/1993 | Gordon et al. | 257/530 |
| 5,200,652 | 4/1993 | Lee | 326/47 |
| 5,203,075 | 4/1993 | Angulas et al. | 29/830 |
| 5,210,940 | 5/1993 | Kawakami et al. | 29/852 |
| 5,216,278 | 6/1993 | Lin et al. | 257/688 |
| 5,218,679 | 6/1993 | Hasegawa et al. | 395/836 |
| 5,220,490 | 6/1993 | Weigler et al. | 361/777 |
| 5,229,549 | 7/1993 | Yamakawa et al. | 174/262 |
| 5,233,217 | 8/1993 | Dixit et al. | 257/530 |
| 5,248,517 | 9/1993 | Shrier et al. | 427/58 |
| 5,250,228 | 10/1993 | Baigrie et al. | 252/511 |
| 5,250,470 | 10/1993 | Yamaguchi | 437/211 |
| 5,258,643 | 11/1993 | Cohen | 257/530 |
| 5,260,519 | 11/1993 | Knickerbocker et al. | 174/262 |
| 5,260,848 | 11/1993 | Childers | 361/127 |
| 5,262,754 | 11/1993 | Collins | 338/21 |
| 5,264,729 | 11/1993 | Rostoker et al. | 257/774 |
| 5,282,271 | 1/1994 | Hsieh et al. | 395/872 |
| 5,282,312 | 2/1994 | DiStefano et al. | 29/830 |
| 5,287,620 | 2/1994 | Suzuki et al. | 29/852 |
| 5,300,208 | 4/1994 | Angelopoulos et al. | 205/50 |
| 5,311,053 | 5/1994 | Law et al. | 257/529 |
| 5,316,853 | 5/1994 | Shibata et al. | 428/416 |
| 5,317,801 | 6/1994 | Tanaka et al. | 29/830 |
| 5,319,238 | 6/1994 | Gordon et al. | 257/530 |
| 5,321,322 | 6/1994 | Verheyen et al. | 326/41 |
| 5,328,087 | 7/1994 | Nelson et al. | 228/175 |
| 5,329,153 | 7/1994 | Dixit | 257/530 |
| 5,345,106 | 9/1994 | Doering et al. | 257/675 |
| 5,346,750 | 9/1994 | Hatakeyama et al. | 428/209 |
| 5,347,258 | 9/1994 | Howard et al. | 338/333 |

| | | | |
|---|---|---|---|
| 5,349,248 | 9/1994 | Parlour et al. | 307/465 |
| 5,362,676 | 11/1994 | Gordon et al. | 437/192 |
| 5,367,764 | 11/1994 | DiStefano et al. | 29/830 |
| 5,377,124 | 12/1994 | Mohsen | 364/489 |
| 5,397,921 | 3/1995 | Karnezos | 257/779 |
| 5,402,318 | 3/1995 | Otsuka et al. | 361/794 |
| 5,404,637 | 4/1995 | Kawakami | 29/843 |
| 5,409,865 | 4/1995 | Karnezos | 437/210 |
| 5,410,806 | 5/1995 | Schneider | 29/840 |
| 5,420,456 | 5/1995 | Galbi et al. | 257/529 |
| 5,420,460 | 5/1995 | Massingill | 257/693 |
| 5,424,492 | 6/1995 | Petty et al. | 174/250 |
| 5,435,480 | 7/1995 | Hart et al. | 228/180.1 |
| 5,436,412 | 7/1995 | Ahmad et al. | 174/265 |
| 5,438,166 | 8/1995 | Carey et al. | 174/261 |
| 5,451,811 | 9/1995 | Whitten et al. | 257/530 |
| 5,464,790 | 11/1995 | Hawley | 437/60 |
| 5,468,995 | 11/1995 | Higgins, III | 257/697 |
| 5,481,795 | 1/1996 | Hatakeyama et al. | 29/852 |
| 5,487,218 | 1/1996 | Bhatt et al. | 29/852 |
| 5,502,889 | 4/1996 | Casson et al. | 29/830 |
| 5,537,108 | 7/1996 | Nathan et al. | 340/825.84 |
| 5,572,409 | 11/1996 | Nathan et al. | 361/806 |
| 5,574,311 | 11/1996 | Matsuda | 257/697 |
| 5,583,376 | 12/1996 | Sickler et al. | 257/702 |
| 5,583,378 | 12/1996 | Marrs et al. | 257/710 |
| 5,612,574 | 3/1997 | Summerfelt et al. | 257/783 |
| 5,640,308 | 6/1997 | Osann, Jr. et al. | 361/777 |
| 5,654,564 | 8/1997 | Mohsen | 257/209 |

OTHER PUBLICATIONS

Chenming Hu, "Interconnect Devices for Field Programmable Gate Array," IEEE, 1992, pp. 591–594.

Steve Chiang, Rahim Forouhi, Wenn Chen, Frank Hawley, John McCollum, Esmat Hamdy and Chenming Hu, "Antifuse Structure Comparison for Field Programmable Gate Arrays," IEEE, 1992, pp. 611–614.

Bernie DiMarco and Steve Hansen, "Interplay of Energies in Circuit Breaker and Fuse Combinations," 1991 IEEE, pp. 1765–1769.

Fred Ki, Raj Bachireddy, Darryl Jeong, Steve Cheng and Thu Nguyen, "An Ultra High Speed ECL Programmable Logic Device," IEEE 1990 Bipolar Circuits and Technology Meeting 3.1.

Ali Iranmanesh, Steve Jurichich, Vida Ilderem, Rick Jerome, SP Joshi, Madan Biswal, Bami Bastani, "Advanced Single Poly BiCMOS Technology for High Performance Programmable TTL/ECL Applications," IEEE, 1990.

Ron Iscoff, "Characterizing Quickturn ASICS: It's Done with Mirrors," Semiconductor International, Aug. 1990.

Esmat, Hamdy, John McCollum, Shih–ou Chen, Steve Chiang, Shafy Eltoukhy, Jim Chang, Ted Speers, and Amr Moshen, "Dielectric Based Antifuse for Logic and Memory ICs," IEDM, 1988, pp. 786–789.

James B. Gullette and Douglas M. Green, "Laser Personalization of NMOS Digital Topologies," Texas A&M University, 1993 IEEE, International Syposium on Circuits and Systems, pp. 1249–1252.

Masafumi Tanimoto, Junichi Murota, Yasuo Ohmori, and Nobuaki Ieda, "A Novel MOS PROM Using a Highly Resistive Poly–Si Resistor," 1980 IEEE, pp. 517–520.

"Polyswitch Resettable Fuses for Circuit Protection Information Package", Raychem Corporation, Electronics Division, Nov. 9, 1992.

Ruschau et al., "Critical Volume Fractions in Conductive Composites", Journal of Composite Materials, vol. 26, No. 18/1992, pp. 2727–2735.

ASM Hansbook, Ally Phase Diagrams, vol. 3, Ni–P, 2.313, 1991.

"TAIYO PSR–4000 Photoimageable Solder Mask (Two–Part Aqueous Developing System)", TAIYO America, Inc., Feb. 24, 1992, pp. 1–8.

"Matsushita Team Eliminates Holes in High–Density PCB", Kenji Tsuda, Nikkei Electronics Asia, Mar. 1995, pp. 69–70.

"An Enhanced Performance Low Cost BGA Package", Robert Marrs, etc., pp. 214–225.

"Printed Circuit Board Design Guidelines For Ball Grid Array Packages", Patrick Johnston, Motorola, Inc., pp. 255–260, no date.

Letter to Hugo Goris from J. Rapaille dated Jul. 6, 1994, Philips Components, 2 pages.

"I/O Buffering System to a Programmable Switching Apparatus", Wen–Jai Hsieh, Official Gazette, Jan. 25, 1994, 1 page.

"CMOS Resistive Fuses for Image Smoothing and Segmentation", Paul C. Yu, etc., IEEE, Journal of Solid–State Circuits, vol. 27, No. 4, Apr. 1992, pp. 545–553.

Morrison, J.M., et al., "A Large Format Modified TEA $CO_2$ Laser Based Process for Cost Effective Small Via Generation", MCM '94 Proceedings, pp. 369–377, (1994).

Redmond, T.F., et al., "The Application of Laser Process Technology to Thin Film Packaging", IEEE, pp. 1066–1071, (1992).

Stopperan, J., "Rigid–Flex: The Old and The New", date unknown, (4 pages).

Wada, Y., "A New Circuit Substrate For MCM–L", ICEMCM'95, Abstract, pp. 60–64, (1995).

ANTIFUSE INTERCONNECT BETWEEN TWO CONDUCTING LAYERS OF A PRINTED CIRCUIT BOARD

FIELD OF INVENTION

The present invention is related to a method of forming an electrical conductor between layers of a printed circuit board and to the resulting printed circuit board. More particularly, the present invention is related to the formation of an electrical conductor between two electrodes of a printed circuit board by applying a programming voltage across a dielectric layer that separates the two electrodes.

BACKGROUND

One of the most expensive steps in fabrication of a multi-layered printed circuit board is formation of an electrical conductor (sometimes called via) between the layers by drilling a via hole through the layers and plating the via hole with a conductive layer.

One desirable characteristic of a via in a printed circuit board is smaller size that permits larger number of traces to be formed in a printed circuit board of a given area. Conventional drilling process is mechanical. As the size of the via hole to be drilled becomes smaller, the drill bit size decreases and the cost of making a small and precise drill bit goes up. Additionally, the low mechanical strength of a small drill bit causes faster wear as compared to a large drill bit.

Therefore the cost of mechanically drilling a small hole increases exponentially with decreasing hole size. Another disadvantage of mechanical drilling is that a drill bit wears out after being used a number of times.

The mechanical drilling process needs a target area (sometimes called "land") that is larger than the drill bit's size, to account for possible misalignment during drilling. The diameter of the land is typically 10 to 15 mils larger than the drill bit diameter. The space used to satisfy the land requirement also substantially limits the number of traces that can be formed in a given area. For typical state of the art processing, where a conductive line (also referred to as "trace" or "electrode") and space have widths 3 mils/3 mils respectively, the via holes diameter is 8 mils, with 13 to 15 mils diameter in land space.

Another problem with mechanical drilling is that a conductive layer must be plated inside the via hole. The smaller the via hole, the larger the aspect ratio between the layer's thickness and the drill's hole diameter, and the more difficult it is to plate the via hole.

A method to inexpensively reduce the via hole's size and create a reliable conductive path in the via hole is highly desirable.

A laser method, by focusing the energy from a laser beam, can create a very small hole having a diameter for example in 1 to 2 mil range. The laser method avoids the problem of drill bit wear. However the laser method is expensive, and the hole's size and the impact on the material are not reproducible. Also the initial setup cost of the laser method is very high.

Another approach is to etch vias with a dry etch process. A large number of vias can be etched simultaneously, which eliminates the drill bit wear problem. In the dry etch method, a thin polyimide layer with copper foils laminated on each side is used as the starting core layer. Photoresist is applied on both sides to define photo via holes. After chemical copper etching and resist stripping, polyimide inside the original photo via hole (where the copper is already removed) is exposed to plasma. After the polyimide is etched away inside the via hole, a metallization step is performed to coat an electrically conductive layer inside the via hole. Another photo masking and etch step is performed to create conductive trace patterns (e.g. of copper) on both sides of the core layer and with vias connecting traces from each side of the core layer.

The dry etch process also has several disadvantages. Alignment/registration tolerance is high as two images from each side must coincide. Without such alignment, the created via hole could have a zig-zagged shaped surface that is unreliable after metallization. The laminate must be very thin as a plasma etch takes very long time (as compared to other printed circuit board processes). The substrate material may be limited to polyimide, as the heat generated in the dry etch is high and thermal mismatch between substrate and copper could create buckling or delamination.

Another alternative to the mechanical drilling process is use of a photoresist process to create a small via hole, e.g. 2 mils in diameter. Then the surface is metallized followed by trace definition on the photoresist surface. The imaging material could be a photosensitive photoresist, or it could be a dry film pressed to the surface. This method allows a large number of vias to be produced simultaneously at a very low cost. Once the photo resist opening is created, the current practice is to do electroless copper deposition and create an electrically conductive layer inside the via hole. Since the electrically conductive layer in general doesn't adhere to the electrically nonconductive photo resist wall, chemical treatment is necessary to roughen the surface of the via hole before applying the electrically conductive layer. Such chemical treatment also roughens the top surface of the photoresist. For a thin photoresist layer, such roughness on the top surface is undesirable as it increases the chances of shorts between two electrode layers. Further, roughening the via hole increases the photo via hole's size. By the time a photo via hole has been prepared for the electrically conductive layer deposition, the hole size has increased substantially. Since the roughening process is less controllable, the quality of the plated via is not as reproducible. Also, the registration capability is poor at present for trace definition that overlaps the via hole. The technology is not mature enough yet to fully reduce the via pitch even if the via size is very small.

Yet another method uses conductive epoxy resin. After the via hole is created, a conductive epoxy is formed inside the via hole. This method offers via pitch reduction. However, conductive epoxy doesn't adhere well to an electrode if the electrode is made of copper. Moreover, copper can oxidize and create high resistance. To make the contact reliable, inert metals like gold are sometime used to form an interface between conductive epoxy resin and copper electrode, which increases the cost and can present process compatibility problems.

SUMMARY

In one embodiment of this invention, a number of locations of a printed circuit board at which an electrical conductor is to be formed between two conductive layers are determined based on the circuit to be implemented in the printed circuit board. A number of photo via holes are formed at the locations in the dielectric layer that separates the two conductive layers. The via holes are then filled with a dielectric material of low breakdown voltage, as compared to the breakdown voltage of the dielectric layer. Then a programming voltage is applied across the dielectric material in the via holes to form an electrical conductor in the via holes.

In one embodiment, the steps for forming an electrical conductor between conductive layers of a printed circuit board include the following steps: (1) applying a first dielectric material on a first conductive layer; (2) forming a number of via holes at each of the predetermined locations in the first dielectric material at which an electrical conductor is to be formed; (3) selectively applying a second dielectric material to at least fill each of the via holes, to form a composite dielectric layer; (4) applying a second conductive layer on the composite dielectric layer; (5) etching the first conductive layer to form a first electrode; (6) etching the second conductive layer to form a second electrode; and (7) applying a programming voltage across the second dielectric material in each of the via holes to form an electrical conductor in each of the via holes, each electrical conductor connecting an electrode in the first conductive layer to an electrode in the second conductive layer.

The use of an electrical conductor of a programmed antifuse instead of a conventional via has several advantages. The electrical conductor (also referred to as an "antifuse-via") can be formed selectively anywhere an electrode of one layer crosses an electrode of another layer without the need to use a drill bit. The present invention allows the use of any of several methods of manufacturing an antifuse in a printed circuit board to create an antifuse via. One method is to start with photo resist and create a photo via hole. Then, instead of plating the created via hole, a nonconductive dielectric antifuse material, such as a polymer loaded with conductive particles (composite polymer) is applied over the entire surface in addition to fill the via hole. Finally a top metal electrode is formed over the antifuse.

The above method can be simplified to eliminate the formation of via holes by providing a layer of antifuse material (such as polymer/particle composite) sandwiched between two conductive layers instead of the dielectric material. After printing and etching to create electrodes of a first conductive layer and electrodes of a second conductive layer each location of overlap between an electrode of the first layer and an electrode of the second layer becomes a possible site for an antifuse via. By selectively programming the antifuse material at predetermined sites, connection is made between the two electrodes through a programmed antifuse conductive path.

In one embodiment, two antifuses are programmed together (simultaneously) by applying programming voltage only to one conductive layer. In another embodiment, antifuse material is programmed using both conductive layers.

BRIEF DESCRIPTION OF THE DRAWING

FIGS. 2A–2L illustrate structures formed during the formation of antifuse-vias in one embodiment of this invention.

DETAILED DESCRIPTION

Antifuses can be used as programmable interconnect in substrates other than silicon, such as the printed circuit substrate (PCB) and multichip module substrate (MCM) as described in, for example, U.S. patent application Ser. No. 08/320,145, filed by B. Nathan et al. on Oct. 7, 1994, entitled PROGRAMMABLE/REPROGRAMMABLE STRUCTURE USING FUSES AND ANTIFUSES that is incorporated by reference herein in its entirety.

In MCM form, the substrate can be either plastic or ceramic. When antifuses are used as programmable interconnects, a matrix structure is created and only antifuses in the antifuse matrix that are needed to form interconnects are programmed (to form a short). The unprogrammed antifuses in the matrix remain open.

The present invention also uses programmed antifuses as interconnects. In this invention, the location of each site of an electrical conductor that connects two conductive layers is predetermined by the circuit design requirement of the printed circuit board to be fabricated. In a site that needs a via, an antifuse is fabricated and the antifuse is programmed to form an electrical conductor (also referred to as "antifuse via"). A matrix of antifuses is not necessary in one embodiment of this invention.

As the antifuse material can be applied in one step, this invention eliminates the mechanical drilling of many vias and dramatically reduces the spacing requirement. Also because antifuse material is nonconductive, this invention also avoids the adhesion problem of requiring the material (such as copper) located in a via hole to adhere to the wall of the via hole. The programming step to create an electrical conductor, also called short in the antifuse material can be accomplished during testing of a printed circuit board. In addition to checking whether an antifuse via is open or short, a predetermined programming voltage and a predetermined programming current are applied such that the antifuse material breaks down and creates a permanent short.

Figure 1:
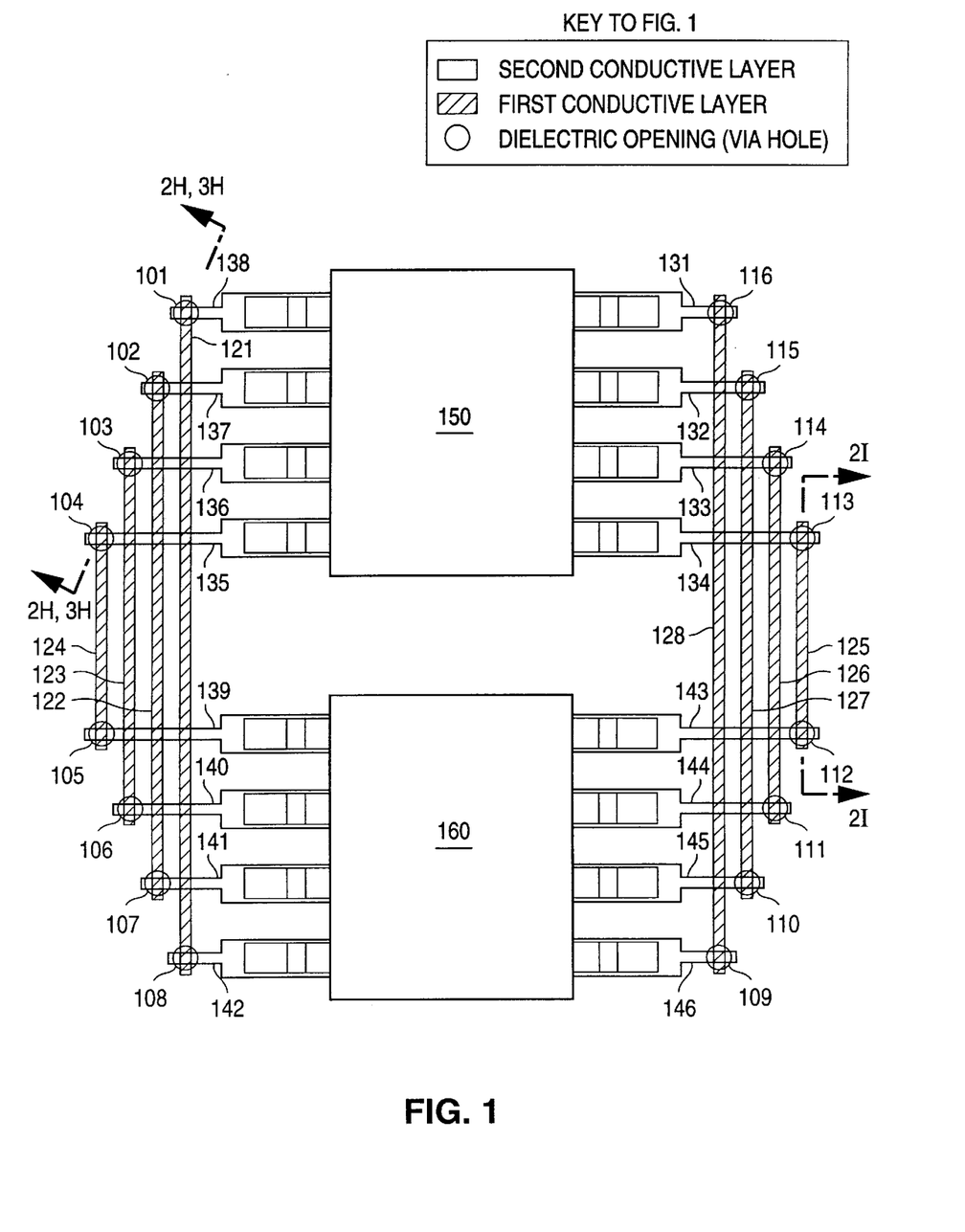
FIG. 1 illustrates in plan view the traces of a printed circuit board that has antifuse-vias.

FIG. 1 illustrates traces 131–146 of a second conductive layer and traces 121–128 of a first conductive layer that are connected by antifuse-vias 101–116 in accordance with the present invention. The traces 131–146 and 121–128 can be used to form a printed circuit board to implement a predetermined circuit that couples integrated circuits 150 and 160.

The first and second conductive layers are separated from each other by a dielectric layer. The dielectric layer is formed of a first dielectric material and has a number of via holes that extend from the first conductive layer to the second conductive layer. The holes are filled with an antifuse material. Electrical conductors connecting traces 121–128 of the first conductive layer and traces 131–146 of the second conductive layer are formed through the antifuse material by application of a programming voltage. The antifuse material has a breakdown voltage less than the breakdown voltage of the first dielectric material. The first dielectric material is a printed circuit board dielectric material such as photoresist material, solder mask, epoxy resin and photo imagible polyimide. The first electrode and the second electrode are electrodes in a printed circuit board, such as electrolytic plated copper electrodes or copper foil electrodes.

Figure 2A:
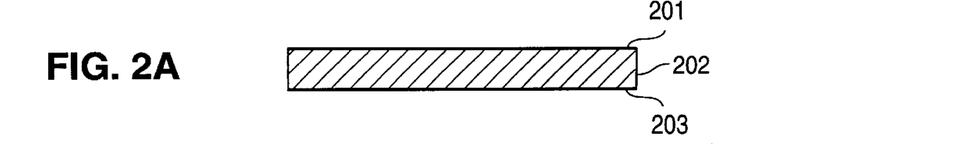
Figure 2B:
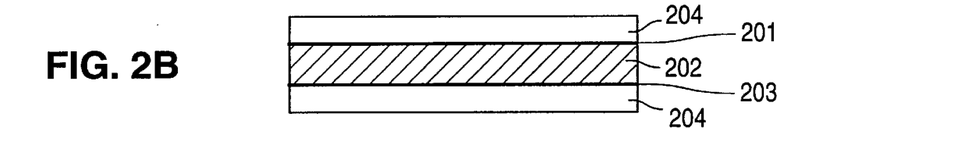
Figure 2C:
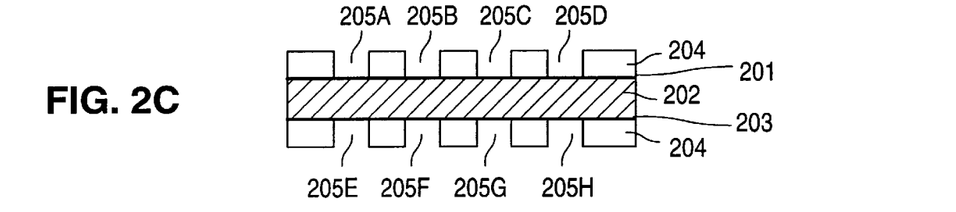
Figure 2D:
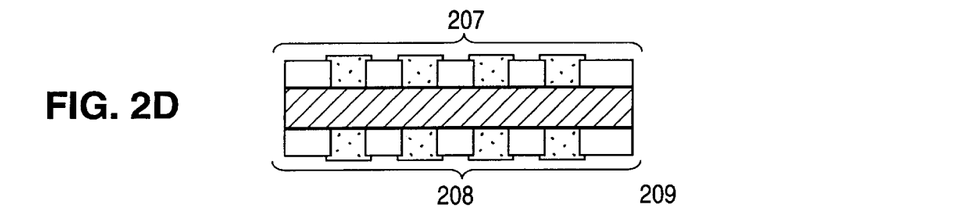
Figure 2E:
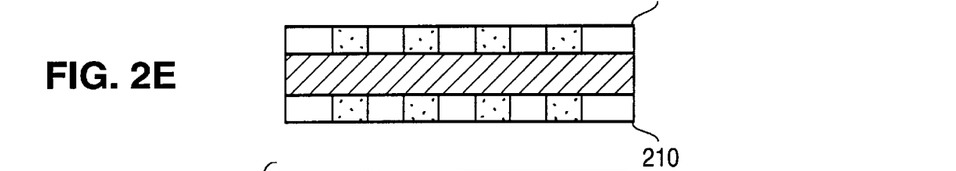
Figure 2F:
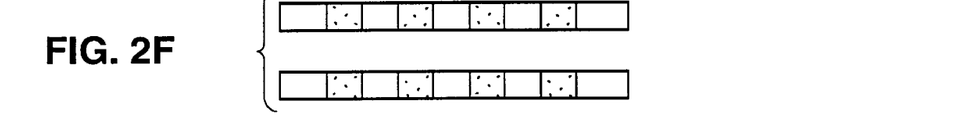
Figures 2G, 2H:
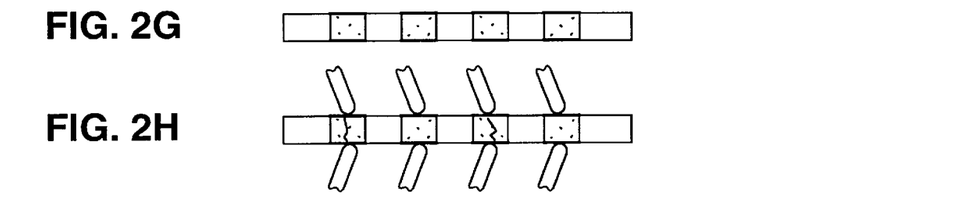
Figure 2I:
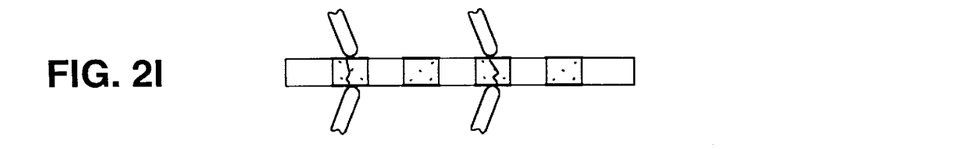
Figure 3A:
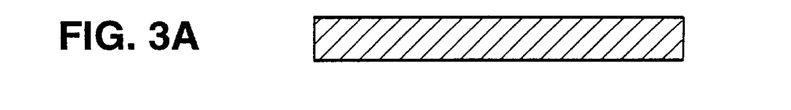
FIGS. 3A–3H illustrate a structures formed by the steps of another embodiment of this invention.
Figure 3B:
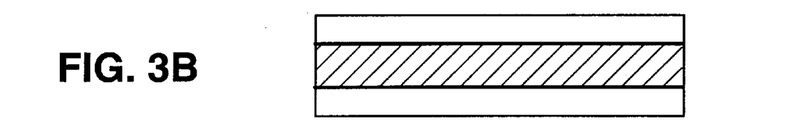
Figure 3C:
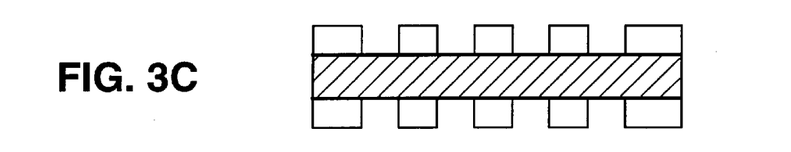
Figure 3D:
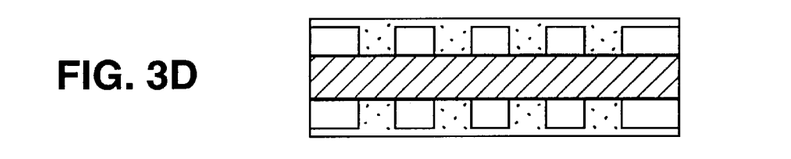
Figure 3E:
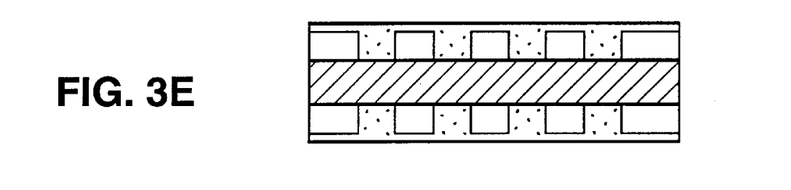
Figure 3F:
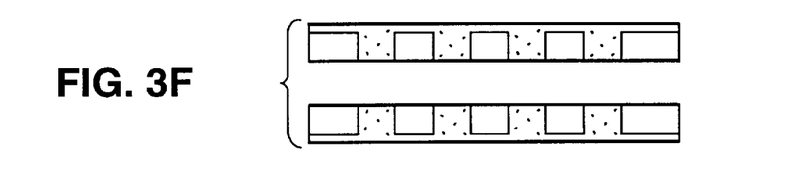
Figure 3G:
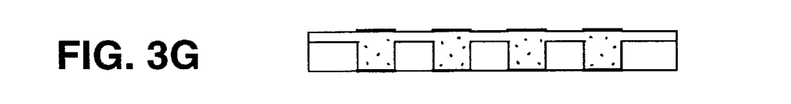
Figure 3H:
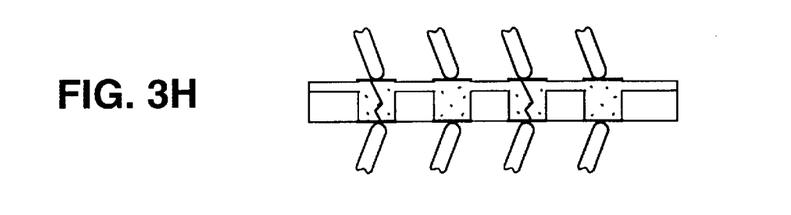

In one embodiment fabrication of a printed circuit board that contains the traces 131–136 and 121–128 and antifuse-vias 101–116 starts with a copper foil as the substrate, as illustrated in FIGS. 2A–2H. The copper foil 201 can be supported by an aluminum foil and held loosely by a glue (not shown). The other side of aluminum foil 202 can also support another thin layer of copper foil 203 and form a copper aluminum-copper foil structure (CAC) 200. Then an dielectric layer 204 is applied and imaged to create via opening holes 205A–205H. Then antifuse material 206A–206H is applied inside via holes 205A–205H through selective printing to form a compound layers 207 and 208. Alternatively, antifuse material can be applied to cover the entire dielectric surface and also fill the via hole as illustrated in FIG. 3D. Then metal layers 209 and 210 are formed on top of compound layers 207 and 208 through either chemical processing (electroless copper deposition or electrolytic copper deposition) or physical processing (similar to laminating copper foils). The bottom copper layers 201 and 203 are then separated from aluminum foil 202. Print and etch then can be done to create patterns of electrodes (FIG. 2G). The structure is in the laminate form, antifuse-vias can be programmed by addressing both electrodes from either side of the surface (FIG. 2H) or from the same side of the surface (FIG. 2I). All of the antifuse-vias 101–116 (FIG. 1) are programmed by FIG. 2H. This method solves the capacitance problem (above) and reduces or eliminates the Vpp/2 requirement (above). Wet chemical process using an acid can cause glue between copper foils 201 and 203 and aluminum foil 202 to unglue and is preferably avoided.

In one embodiment, a composite is formed of a polyimide or an epoxy as the polymer body and one or more type of conductive particles such as particles of nickel, silver and copper that form a volume fraction of 10–20 percent of the total composite volume.

Figure 2J:
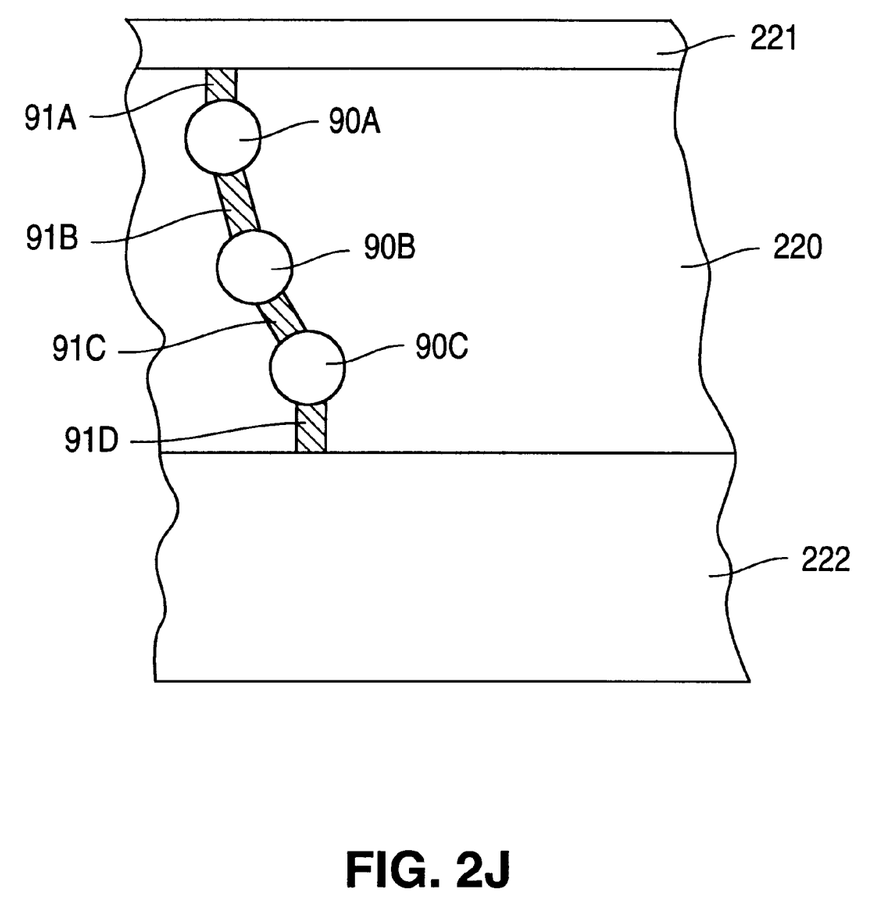
FIG. 2J illustrates the formation of a conductive link through the antifuse of FIG. 2H.

If a voltage is applied sufficient to cause a breakdown of the polymer body separating the conductive particles in a composite, a conductive path can be formed between the two electrodes of an antifuse, with minimal transportation of electrode material into the dielectric. For example, FIG. 2J illustrates a path formed by links 91A, 91B, 91C and 91D between conductive particles 90A, 90B, 90C, and the two electrodes 221–222 of an antifuse 220 (FIG. 2H). A link between two conductive particles can be formed due to fusion of the two conductive particles in the region where the dielectric between the particles breaks down.

If conductive particles in an antifuse have a lower melting temperature than the antifuse electrodes' melting temperature, deformation of the electrodes can be avoided. So conductive particles for an antifuse can be formed of low melting temperature materials, even if such materials are unsuitable for forming electrodes or interconnection traces of high melting temperature.

Figure 2K:
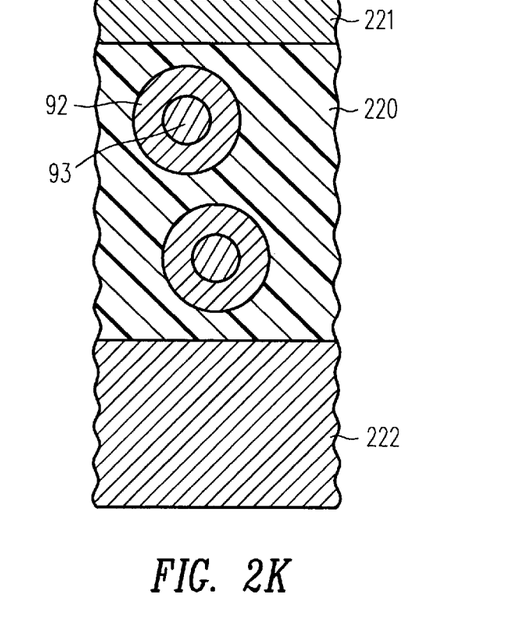
Figure 2L:
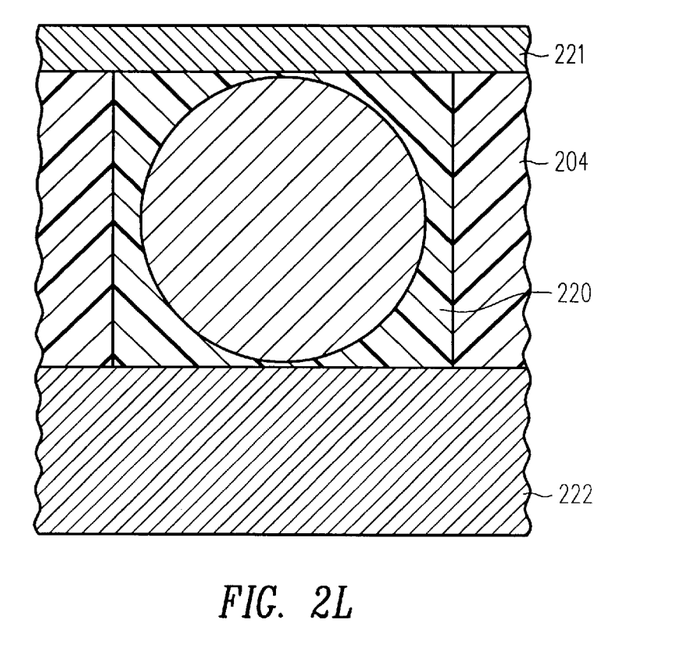

FIG. 2K shows an embodiment where the conductive particles of the antifuse have inner core 93 and outer layer 92 of a lower melt temperature than core 93. FIG. 2L shows the conductive particle having substantially the same diameter as the via of the antifuse.

The method illustrated in FIGS. 3A–3H is similar to the method described above for FIGS. 2A–2H, except for the difference noted above for FIG. 3D.

Figure 4A:
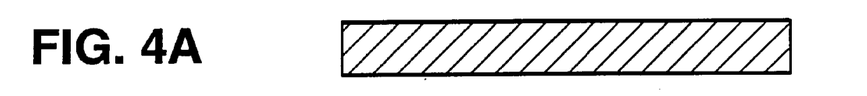
FIGS. 4A–4F illustrate a structures formed by the steps of another embodiment of this invention.
Figure 4B:
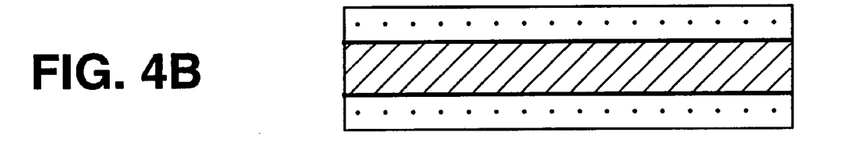
Figure 4C:
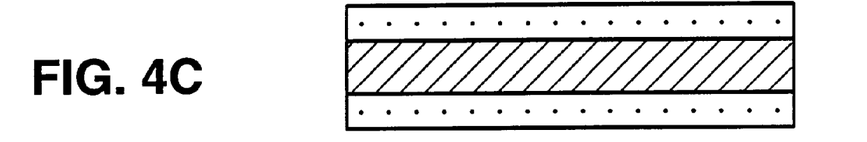
Figure 4D:
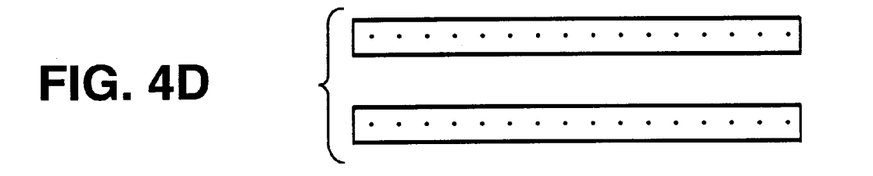
Figure 4E:
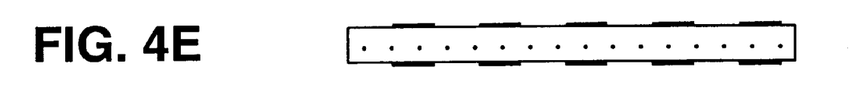
Figure 4F:
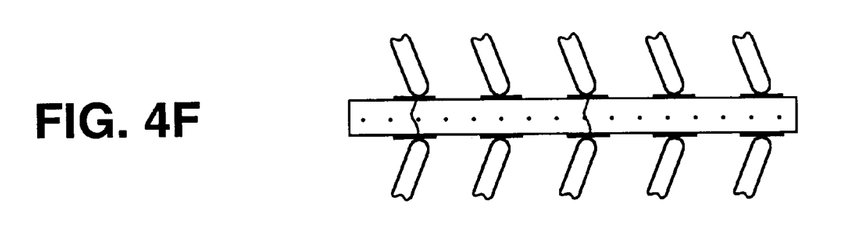

FIGS. 4A–4F illustrate another method similar to the method illustrated in FIGS. 2A–2I of except for the following differences. In the method of FIGS. 4A–4F a dielectric layer is not formed and photo via holes are not formed. Instead, antifuse material is directly applied to the copper layers as shown in FIG. 4B. The steps shown in FIGS. 4C–4E are similar to the steps shown in FIGS. 2E–2G. Then certain selected sites of antifuse material are programmed to form antifuse-vias at for example sites 501–516 (FIG. 5).

Figure 5:
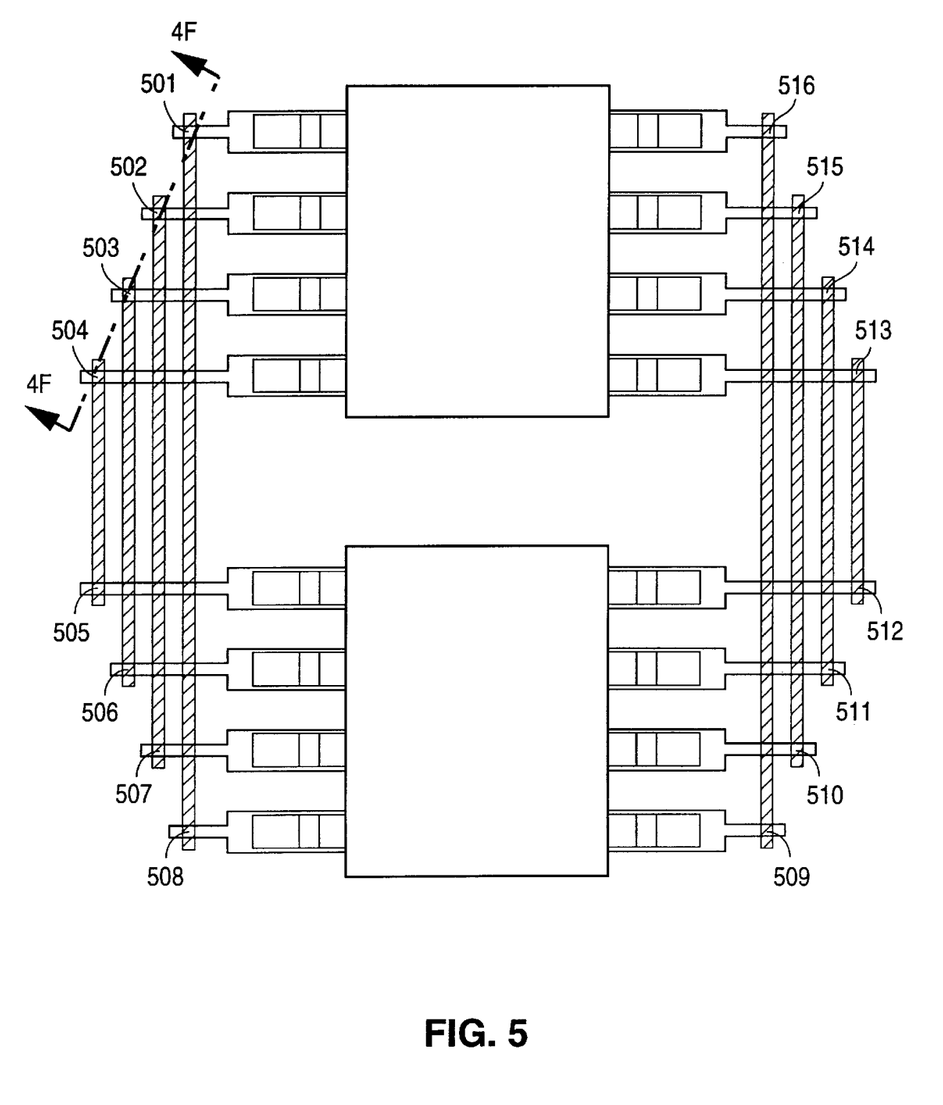
FIG. 5 illustrates in plan view the traces of another printed circuit board that has antifuse-vias.

In the embodiment of FIG. 5, laminate thickness is 2 mils (milli inches), for use in products such as flex circuits, PCMCIA cards and MCMs. The antifuse laminate thickness can be made from 0.5 mil to 5 mils. Also, by adjusting (increasing) the percentage of conductive particles to keep the programming voltage constant, the laminate can be made even thicker. The copper foil thickness is not critical to one embodiments of this invention. Conventional thickness of ¼, ½, 1, or 2 Ounce copper all can be used. The polymer base for the antifuse can be either epoxy resin, or polyimide. Other types of material, that offer low dielectric constant, such as fluorine based Teflon, PTFE, also can be used.

One advantage of this invention is that the structures shown in FIG. 4D can be made ahead of time, and sold as blanks to be customized by an end user, such as a printed circuit board (PCB) vendor. A PCB vendor can integrate use of such structures into a PCB process, instead of developing an antifuse process. In addition, antifuse-vias can be created at any overlapping area between conductive traces of two PCB layers and areas. Vias which were necessary for the mechanical drilling are eliminated by this invention, which allows the via pitch (distance between two antifuse-vias) to be as small as, for example, 3 mils, while the line and space can be at 1 mil each in areas without a via. Another advantage is that antifuse vias can be done in multiple layers, even as the inner layers, to further reduce the board cost.

In order to eliminate the process routing constraint, another process alternative is proposed. In this process, via hole opening is created only in the place that needs a via. Then traces can cross over other lines without forming an unwanted antifuse via. The starting point is to have copper foils clad to both sides of a PCB core. Then print and etch step is done to form traces on the copper foils. Then via openings are formed. Methods of forming via holes include photo resist opening, laser drill, or dry film or liquid phase solder masking. Via hole size created by these methods could range from 1 to 10 mils easily. Then antifuse via material is applied over the top surface. It could be all over the surface or just in areas close to via holes. After processing, metal layers are applied to the top photoresist surface and/or antifuse surface. After the top metal layer is printed and etched to form traces.

Methods of applying antifuse materials over the whole surface include screen printing, liquid curtain coating, spraying, liquid immersion coating. An optional step is to apply antifuse material over a selective area near the via hole, for example, by screen printing. This will eliminate programming of an horizontal antifuse between the two adjacent lines which is discussed below. Several methods can be used to form the top electrode too. One method is by laminating a thin sheet of copper foil to the core followed by print and etch steps. Another method is by using the conventional electroless copper process followed by the electrolytic copper deposition to form the top electrode then followed by the print and etch steps. In this method, reducing the surface roughness treatment prior to applying the copper is important. There are methods available that reduce the to surface roughness down to less than 1um.

A variation to the above process is eliminating the via opening step. Since coating over metal electrode will tend to be thinner than the area without electrode, the capacitance penalty could be less compared to the laminate process described earlier. But it still doesn't eliminate the programming of horizontal antifuse problem as it is only space limited.

The preferred process in this case is the antifuse built inside the via opening to create an antifuse via. The photoresist process is preferred to create a via hole opening. The hole diameter is 5 mils although as low as two mils are doable. The antifuse material is best applied by liquid immersion coating if the whole surface is coated. In the selected coating method, the preferred method is by screen printing. The top electrode is applied by laminating the foil to the antifuse surface followed by print and etch process.

The advantage of this process is that it reduces substantially the signal cross talk issue between two metal traces. The photo resist thickness or solder mask thickness used to open the via can be adjusted. Also, the adjustment of this thickness permits impedance control of the signals. In the PCB design, controlling impedance of the signal is very important for the high speed application of the board. And the impedance control can't be accomplished if the line space and layer thickness cannot be adjusted over a required range. Another advantage is that now the antifuse via only occurs in the places that is needed, the cross over of lines becomes possible as there is no via in the cross over where there is no need for connection. This allows the routing of traces to be done much more effectively.

One of the disadvantages is that the requirement of a core for the process limits the antifuse via to only one side of the board. For connections between layers on the opposite side of the core, drilled vias are necessary.

As used in this application, an "antifuse-via" is any electrical conductor formed between two electrodes in two layers of a printed circuit board that are separated by at least a layer of antifuse material wherein the conductor is formed by applying a programming voltage across the two electrodes. In one embodiment the antifuse material is a dielectric material that has a low breakdown voltage compared to the breakdown voltage of all other dielectric materials in the printed circuit board.

Several considerations are taken into account in selecting the antifuse material. First, in a programmable antifuse matrix, only a small number of antifuses need to be programmed while the majority of antifuses remain open in a printed circuit board that implements a predetermined circuit. To ensure that an unprogrammed antifuse remains open, the antifuse in an antifuse matrix is designed to sustain electrostatic discharge ("ESD") damage. On the other hand, in the present invention there is no antifuse-via that remains open in a printed circuit board that implements a predetermined circuit, because each antifuse via is located between and shorts two electrodes that are to be connected. Therefore even if the antifuse-via suffers some ESD damage, in principle, the antifuse-via can still be programmed to create a more controllable short because uncontrolled ESD damage can result in a resistance that is very high, higher than the specified tolerance.

Conductive particles in an antifuse material can have shapes other spherical, which is preferred for the antifuse matrix material.

Second, an unprogrammed antifuse in an antifuse matrix is designed to sustain a voltage Vpp/2 (Vpp being a predetermined programming voltage) during programming to protect all unprogrammed antifuses from being accidentally programmed. Such a design limits the choice of ingredients used in antifuse material as well as the percentage of the ingredients. The antifuse material for an antifuse via is not limited by processes that require a Vpp/2 constraint. The choice of antifuse material such as the type of polymer or the shape and size of conductive particle can all be different from the antifuse material for forming an antifuse matrix. In one embodiment, the antifuse material can be chosen to be conductive epoxy resin. Also, programming methods and constraints on the programming methods all become different as discussed below.

Antifuse material for antifuse-via is preferably nonconductive. Also, the antifuse material should be compatible with conventional printed circuit board (PCB) processes. Polymers, either thermoplastic or thermosetting, can be used as an ingredient of antifuse material. Other materials, such as epoxy, or polyimide can also be used in the antifuse material. To reduce the voltage needed to program the antifuse-via, conductive particles (e.g. particles 90A–90C of FIG. 2J) can be included in the antifuse material as described in the U.S. Patent Application referenced above. The percentage of conductive particles can be between 10–50%. Also, the programming voltage depends on the particle size and particle shape. Larger conductive particle size is preferred for an antifuse-via for carrying higher currents.

Up to the critical level, the conductive particles remain physically separated from each other by the polymer. A slight increase in the volume fraction of the conductive particles causes a sharp drop in resistivity of the composite, as conductive particles contact each other and form conductive paths through the polymer. The resistivity of a composite can change by 10 orders of magnitude for a small increase in the fraction of conductive particles as shown, for example, in FIG. 1 of "Critical Volume Fractions in Conductive Composites" by G. R. Rusher and R. G. Newman, Journal of Composite Materials, vol. 26, No. 18, 1992.

A composite filled to the critical level where the conductive particles are almost in contact can, nonetheless, have a very high resistance. In one example of such a composite, conductive particles formed of for example solder (melting temperature 150° C. to 200° C.) can be embedded in a polymer (melting temperature 300° C. to 400° C.), although electrode traces are formed of copper (melting temperature 1083° C.). A layer of such a composite can be used, instead of a dielectric layer as described above, to form an antifuse in accordance with this invention.

Low resistivity conductive particles are preferred as they can lower the resistance of the antifuse via. Therefore conductive particles can be formed of copper, nickel, palladium, platinum, all of which have low resistivities. Low melting metals are also preferred for conductive particles because such metals promote better interface connection between two adjacent particles. Conductive particles can be formed of lead/tin compound, silver/tin compound, tin, nickel/tin, all of which have low melting temperatures. In general a low melting compound has high resistivity while a low resistivity metal has a high melting point. To take advantage of both characteristics, one can coat a low melting metallic compound or metal outer layer on a highly conductive but high melting inner core. The low melting compound outer layer promotes a good contact between the particles and the electrode surface during programming. The highly conductive inner core it reduces the antifuse-vias resistance after programming. A particle's inner core can be formed of copper, silver, silver/tin, palladium, etc. A particle's outer layer can be formed of lead/tin alloy, silver/tin alloy, tin, etc. If current carrying is not critical, particles can include low melting materials, such as silver/tin, lead/tin and tin. The choice of material included in an antifuse particle depends on the purpose and requirement of the printed circuit board to be manufactured.

Particle size and shape can also be selected for optional characteristics for an antifuse-via. The particle shape for an antifuse matrix is preferred to be round. Since an unprogrammed antifuse can be tied to half of the programming voltage (Vpp), the antifuse material is selected so that the antifuse does not break down during the programming period. The choice of shape and size of the particle can be selected to provide a tight, controllable programming voltage range and programming time. In one embodiment, spherical particles are mixed uniformly. The particle size can be chosen so that the particles remain unagglomerated and yet are smaller than the antifuse thickness. In the present invention, all the antifuse-vias are programmed eventually and no antifuse-via remains open. Also the programming voltage range doesn't have to be controlled as tightly because of the lack of the Vpp/2 constraint discussed above. Nonspherical particles such as spikes and long rod, can also be used in the present invention. Such non-spherical particles promote programming at a lower voltage without need for a higher percentage of particle in the antifuse material. The nonspherical shape also results in low capacitance of the antifuse via. In the description spherical particles are used only as an example of the particle shape.

Larger particle size is preferred for the antifuse material used in the present invention. Larger particles provide higher programming current carrying capability. It is preferable that an antifuse-via carry a higher current than a programmed antifuse of an antifuse matrix. For a typical antifuse-via with a 1–2 mil (50 $\mu$m) thickness, the preferred particle size (diameter) is between 5 $\mu$m to 20 $\mu$m. Particle size as large as the antifuse via thickness can create a short essentially inside the antifuse via.

A "horizontal" electrical conductor can form through antifuse material between two adjacent metal lines (i.e. traces or electrodes) of a single conductive layer if the antifuse material completely covers a dielectric layer. The distance between these two lines should be larger than the height of an adjacent antifuse-via to ensure that a short is avoided between two lines during programming to form the antifuse-via. To ensure safety, distance between two lines can be selected to be at least twice the height of an antifuse-via plus process variation considerations. Formation of a horizontal electrical conductor can be totally avoided if the antifuse material is applied only inside a via hole or partially outside the via hole, but not continuously between two adjacent metal lines.

A printed circuit board dielectric material includes any conventional dielectric material that is used to form a printed circuit board.

We claim:

1. A structure comprising:
   a first electrode;
   a second electrode; and
   a dielectric layer located between said first electrode and said second electrode, said dielectric layer being formed of a first material, said first material being non-conductive, said dielectric layer defining a hole, said hole extending from said first electrode to said second electrode, said hole being filled with a second material thereby forming an antifuse between said first electrode and said second electrode;
   wherein
       said second material as a whole is non-conductive, and said second material includes a polymer and a conductive particle;
       said conductive particle forms at least a portion of an electrical conductor connecting said first electrode to said second electrode on application of a programming voltage between said first electrode and said second electrode to breakdown said polymer; and
       said conductive particle has a dimension approximately the diameter of said hole.

2. The structure of claim 1 wherein said second material further comprises a plurality of conductive particles in addition to said conductive particle.

3. The structure of claim 1 wherein:
   said second material has a breakdown voltage less than the breakdown voltage of said first material.

4. The structure of claim 1 wherein:
   said first material includes a material selected from a group consisting of polyimide and epoxy resin.

5. A structure comprising:
   a first electrode;
   a second electrode; and
   a dielectric layer located between said first electrode and said second electrode, said dielectric layer being formed of a first material said first material being non-conductive, said dielectric layer defining a hole, said hole being covered at least partially by said first electrode and by said second electrode; and
   a second material including at least one conductive particle and a dielectric material, said second material being sandwiched between said first electrode and said second electrode;
   wherein
       said first material is photoimagible and said first electrode and said second electrode are electrodes in a printed circuit board; and
       said conductive particle has a dimension approximately the diameter of said hole.

6. The structure of claim 5 wherein said second material as a whole is conductive.

7. A structure comprising:
   a first electrode;
   a second electrode; and
   a dielectric layer located between said first electrode and said second electrode, said dielectric layer being formed of a first material said first material being non-conductive, said dielectric layer defining a hole, said hole being covered at least partially by said first electrode and by said second electrode; and
   a second material including at least one conductive particle and a dielectric material, said second material being sandwiched between said first electrode and said second electrode;
   wherein
       said first material is photoimagible and said first electrode and said second electrode are electrodes in a printed circuit board; and
       the conductive particle comprises an inner core and an outer layer surrounding said inner core, the inner core having a higher melting temperature than the outer layer.

8. The structure of claim 7 wherein said conductive particle includes silver.

9. The structure of claim 7 wherein said conductive particle is at least approximately spherical.

10. The structure of claim 7 wherein said second material as a whole is conductive.

11. The structure of claim 7 wherein said conductive particle has a dimension in the range of 5 $\mu$m to 20 $\mu$m.

* * * * *